(12) United States Patent
Hundt et al.

(10) Patent No.: US 11,129,270 B2
(45) Date of Patent: Sep. 21, 2021

(54) CONTROL DEVICE FOR AN ELECTRIC MACHINE

(71) Applicant: Robert Bosch GmbH, Stuttgart (DE)

(72) Inventors: Harald Hundt, Aichelberg (DE); Shanmugam Kaarthikeyan, Karnataka (IN); Lakshmi Meena Ganesan, Karnataka (IN); Peter Renner, Moessingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/770,246

(22) PCT Filed: Oct. 23, 2018

(86) PCT No.: PCT/EP2018/079001
§ 371 (c)(1),
(2) Date: Jun. 5, 2020

(87) PCT Pub. No.: WO2019/120691
PCT Pub. Date: Jun. 27, 2019

(65) Prior Publication Data
US 2021/0168927 A1    Jun. 3, 2021

(30) Foreign Application Priority Data
Dec. 21, 2017  (DE) .................. 10 2017 223 619.1

(51) Int. Cl.
*H05K 1/02*     (2006.01)
*H05K 7/20*     (2006.01)

(52) U.S. Cl.
CPC ....... *H05K 1/0203* (2013.01); *H05K 7/20454* (2013.01); *H05K 2201/09745* (2013.01); *H05K 2201/10553* (2013.01)

(58) Field of Classification Search
CPC .................... H05K 1/0203; H05K 3/3447
See application file for complete search history.

(56) References Cited

U.S. PATENT DOCUMENTS

| 4,103,321 A | 7/1978 | Gansert et al. |
| 5,276,586 A | 1/1994 | Hatsuda et al. |

(Continued)

FOREIGN PATENT DOCUMENTS

| DE | 11 2014 006 113 T5 | 10/2016 |
| DE | 10 2016 120 314 A1 | 4/2017 |

(Continued)

OTHER PUBLICATIONS

International Search Report corresponding to PCT Application No. PCT/EP2018/079001, dated Jan. 31, 2019 (German and English language document) (5 pages).

*Primary Examiner* — Jeremy C Norris
(74) *Attorney, Agent, or Firm* — Maginot, Moore & Beck LLP

(57) ABSTRACT

A control device for an electric machine includes a circuit board and a cooling body, which are joined together, wherein a heat-conducting paste is introduced between the circuit board and the cooling body at least for thermally connecting the circuit board to the cooling body. The circuit board and/or the cooling body has at least one recess, wherein the recess is formed in the lateral direction between a region to be protected and the introduced heat-conducting paste in such a way that, when the circuit board and the cooling body are joined, an excess portion of the laterally spreading heat-conducting paste can be received by the recess.

9 Claims, 3 Drawing Sheets

(56) References Cited

U.S. PATENT DOCUMENTS

2009/0194869 A1    8/2009   Eom et al.
2016/0021780 A1    1/2016   Schwarz
2016/0233141 A1    8/2016   Hirobe

FOREIGN PATENT DOCUMENTS

EP        1 806 960 A1    7/2007
WO       97/27728 A2    7/1997

CONTROL DEVICE FOR AN ELECTRIC MACHINE

This application is a 35 U.S.C. § 371 National Stage Application of PCT/EP2018/079001, filed on Oct. 23, 2018, which claims the benefit of priority to Serial No. DE 10 2017 223 619.1, filed on Dec. 21, 2017 in Germany, the disclosures of which are incorporated herein by reference in their entirety.

BACKGROUND

The disclosure relates to a control device for an electrical machine, wherein the control device comprises a circuit board and a cooling body, which are joined together, wherein a heat-conducting paste is introduced between the circuit board and the cooling body for thermally connecting the circuit board to the cooling body.

A control device of this type is disclosed, for example, in the published patent application WO 1997027728 A2.

A customary problem in control devices of this type is that, upon the joining of the circuit board to the cooling body, the lateral spread of the heat-conducting paste can only be controlled to a very limited degree, such that the heat-conducting paste can also reach areas which should be free of said heat-conducting paste.

SUMMARY

The disclosure relates to a control device for an electrical machine, wherein the control device comprises a circuit board and a cooling body, which are joined together, wherein a heat-conducting paste is introduced between the circuit board and the cooling body, at least for thermally connecting the circuit board to the cooling body.

One aspect of the disclosure is that the circuit board and/or the cooling body incorporate(s) at least one recess, wherein the recess is configured in the lateral direction between a region which is to be protected and the heat-conducting paste introduced such that, when the circuit board and the cooling body are joined, an excess laterally spreading portion of the heat-conducting paste can be accommodated by the recess.

Advantageously, upon the joining of the circuit board to the cooling body, a lateral overflow of the heat-conducting paste into the region which is to be protected can thus be prevented. The region to be protected is thus a region which is intended to be protected from the heat-conducting paste and in which, correspondingly, there should be no penetration of said heat-conducting paste.

An electrical machine is to be understood, for example, as an electric motor.

An electric motor of this type can be configured, for example, as a three-phase AC synchronous machine or asynchronous machine.

A circuit board typically assumes a planar configuration. This planar circuit board thus provides space upon which at least a proportion of the components required for the actuation of the electrical machine can be arranged. These components can be, for example, a processing unit, particularly a microcontroller, or a bridge circuit which is constituted from semiconductor switches.

The cooling body is comprised of a material having very good thermal conductivity and is, for example, metallic. The cooling body moreover comprises at least one contact surface, which is thermally connected to the circuit board, wherein said contact surface, in particular, also assumes a planar configuration. By the term thermal connection, in turn, it is to be understood that heat can be conducted from the circuit board to the cooling body. Thermal connection is thus achieved by means of the heat-conducting paste which is introduced between the cooling body and the circuit board.

The term heat-conducting paste is to be understood as a malleable material which shows good thermal conductivity. In particular, the heat-conducting paste can also be configured as a heat-conducting adhesive. This heat-conducting paste is typically arranged between the cooling body and the circuit board.

In particular, a cooling body having a correspondingly configured recess can be produced by means of a die casting process. Alternatively, it is also possible that the recess is milled into the cooling body or the circuit board.

By the term joined components, it is to be understood that a permanent mechanical connection is present between the corresponding components. This permanent mechanical connection can be achieved, for example, wherein the circuit board is screwed to the cooling body. Alternatively, the heat-conducting paste can assume an adhesive property, in order to constitute the permanent mechanical connection between the cooling body and the circuit board.

A lateral direction is to be understood as a direction which is oriented perpendicularly to a direction in which the circuit board and the cooling body are joined. This lateral direction is thus typically parallel to the main extension plane of the circuit board or parallel to the main extension plane of the cooling body.

According to one configuration of the control device according to the disclosure, it is provided that the recess is configured as a slot.

Advantageously, a slot can be produced in a simple and cost-effective manner, as a result of which production costs for the control device can be limited.

A slot is to be understood as a longitudinally configured cut-out.

According to one configuration of the control device according to the disclosure, it is provided that the recess entirely encloses the region which is to be protected, and particularly entirely encloses the latter in the lateral direction.

Advantageously, heat-conducting paste cannot penetrate the region which is to be protected from any direction in the corresponding plane. Consequently, the corresponding region is protected from all sides.

By the term entirely enclosed, it is understood that the recess runs around the region which is to be protected with no interruption.

According to one configuration of the control device according to the disclosure, it is provided that, within the region which is to be protected, at least part of an electrical contact-connection of an electronic component with the circuit board is configured, particularly part of a push-through contact-connection.

Advantageously, it can thus be prevented that the heat-conducting paste enters into contact with the electrical contact-connection. In turn, it can thus be prevented that, for example, a short-circuit can be constituted by means of the heat-conducting paste between the contact-connection of the electronic component and other components which are in contact with the heat-conducting paste.

A further advantage is provided in that the corresponding region to be protected is not fouled by the heat-conducting paste, as the heat-conducting paste which penetrates the region to be protected might otherwise handicap, or even render completely impossible the constitution of a corresponding push-through contact-connection and/or soldered connection.

The electronic component can, for example, be an intermediate circuit capacitor.

According to one configuration of the control device according to the disclosure, it is provided that the electronic component is configured in a slug-down technical arrangement.

By a slug-down technical arrangement, it is to be understood that the component is arranged on the cooling body and not, as would otherwise be customary, on the circuit board. However, the component is electrically connected to the circuit board by means of a wired connection, in particular a push-through contact-connection.

Advantageously, by means of the direct contact with the cooling body, heat generated by the component can be evacuated via the cooling body in a particularly rapid and effective manner. This is particularly advantageous for components which are associated with substantial heat generation such as, for example, an intermediate circuit capacitor.

According to one configuration of the control device according to the disclosure, it is provided that at least one electronic component is arranged within the region which is to be protected. In particular, this electronic component can be a sensor unit and/or a component which is covered by a coating.

It can thus advantageously be prevented that the component which is configured, for example, as a sensor unit and the heat-conducting paste enter into mutual contact. In turn, it can thus be prevented that the operational reliability of the sensor unit is compromised by the heat-conducting paste, or that the sensor unit even fails completely as a result of the latter. In particular, the sensor unit can incorporate, for example, a pressure sensor, which might be obstructed in the event of contact with the heat-conducting paste. The sensor unit, for example, can also be capacitively configured.

It is moreover advantageous that contact between the coating and the heat-conducting paste can be prevented. Such a contact, for example, might otherwise generate a physical reaction between the two components which, in turn, might result in an electrochemical migration within the control device, and thus in an increased probability of failure of the control device or of individual electronic components.

The function of the coating can, for example, be the protection of the component against external influences, such as water or dirt. A coating of this type can, for example, be configured as a polymer film.

DETAILED DESCRIPTION

Figure 1:
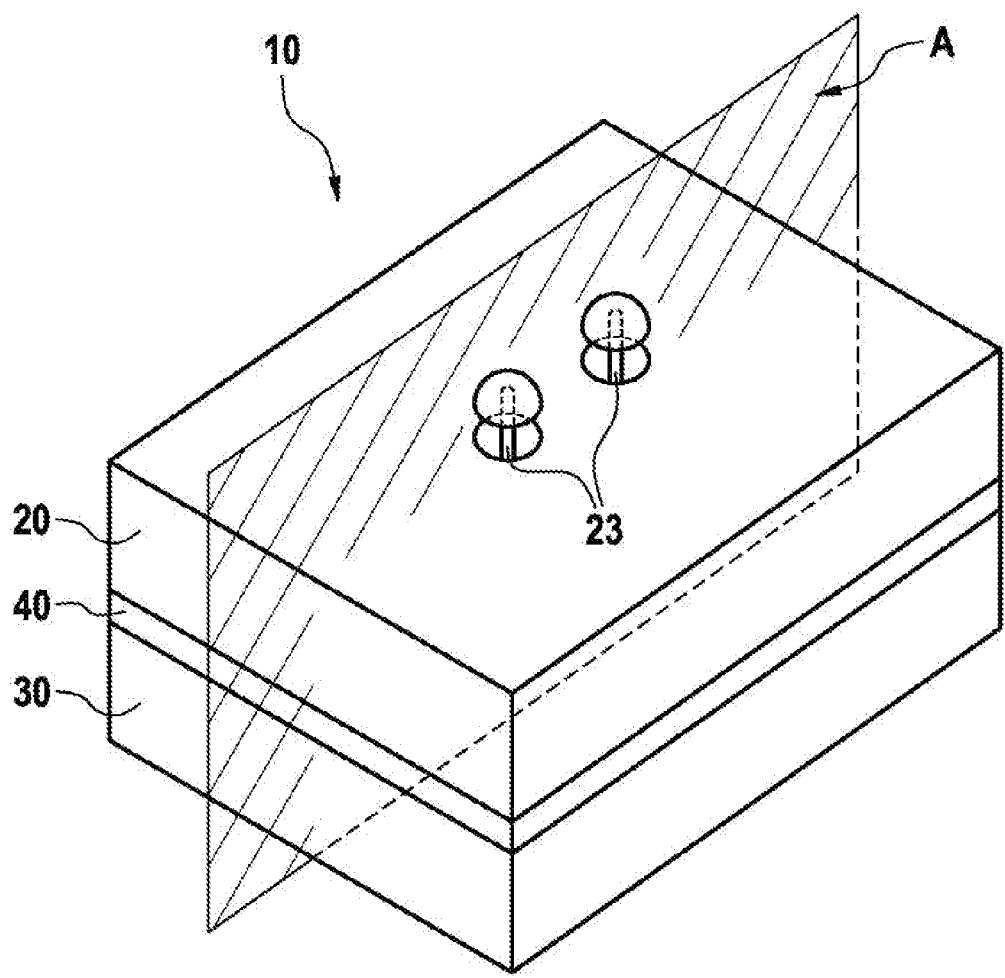
FIG. 1 shows a perspective view of a first exemplary embodiment of a control device according to the disclosure.

FIG. 1 shows a perspective view of a first exemplary embodiment of a control device according to the disclosure.

A control device 10 is represented for an electrical machine, which is not diagrammatically represented. The control device 10 comprises a circuit board 20 having a planar configuration, and a cooling body 30 likewise having a planar configuration. The circuit board 20 and the cooling body 30 are joined together, wherein a heat-conducting paste 40 is introduced between the circuit board 20 and the cooling body 30. Joining can be executed, for example, wherein the heat-conducting paste 40 is configured as a heat-conducting adhesive.

The circuit board 20 further incorporates two openings for electrical contacts of a component 22 which is not visible in FIG. 1. Said electrical contacts of the component 22 are thus configured in the form of a push-through contact-connection 23. The circuit board 20 moreover incorporates space for at least a proportion of the components required for the actuation of the electrical machine, wherein said components are likewise not diagrammatically represented. These components can be, for example, a processing unit, particularly a microcontroller, or a bridge circuit which is constituted from semiconductor switches.

Figure 2:
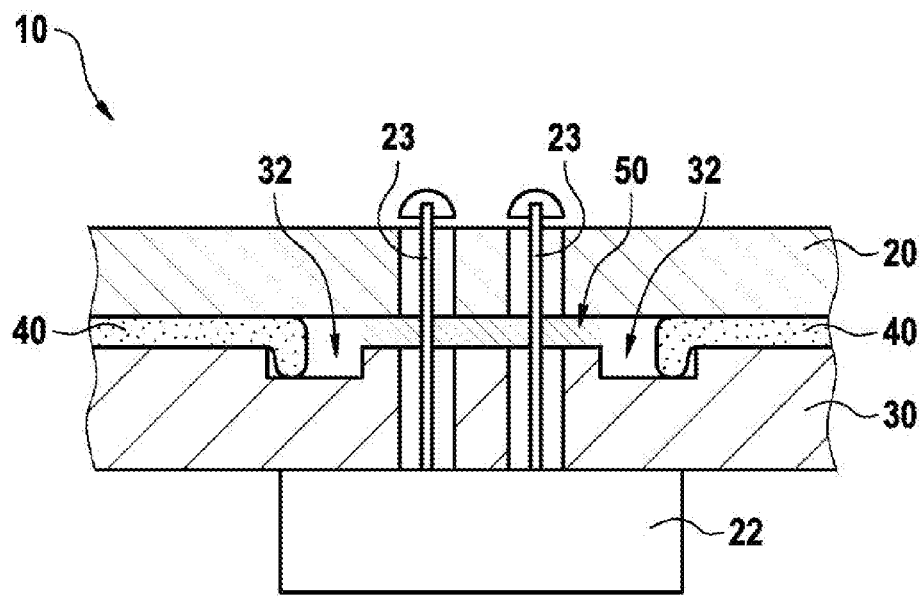
FIG. 2 shows part of a sectional view of the control device according to the disclosure represented in FIG. 1.

FIG. 2 shows part of a sectional view of the control device according to the disclosure represented in FIG. 1. A sectional view of the control device 10 disclosed in FIG. 1 at section plane A is represented.

The control device 10 correspondingly comprises a circuit board 20, a cooling body 30 and a heat-conducting paste 40 which is introduced between the circuit board 20 and the cooling body. The cooling body 30 further comprises a recess 32, which entirely encloses a region 50 which is to be protected. The recess 32 is configured such that, upon the joining of the circuit board 20 and the cooling body 30, an excess portion of the laterally spreading heat-conducting paste 40 can be accommodated by the recess 32, and thus cannot penetrate the region 50 which is to be protected. Joining is particularly executed in a direction which is perpendicular to the main extension plane of the cooling body 30 or to the main extension plane of the circuit board 22.

The control device 10 further comprises a component 22 which is arranged on the cooling body 30 and is thus thermally connected to the latter. For the electrical contact-connection of the component 22 with the circuit board 20, the component 22 comprises two push-through contact-connections 23, which extend through corresponding openings in the cooling body 30 and the circuit board 20, and also extend through the region 50 which is to be protected.

In an exemplary embodiment which is not diagrammatically represented, the recess 32, rather than in the cooling body 30, can also be correspondingly configured in the circuit board 20. In an alternative exemplary embodiment, correspondingly configured recesses can also be constituted in both the circuit board 20 and in the cooling body 30.

Figure 3:
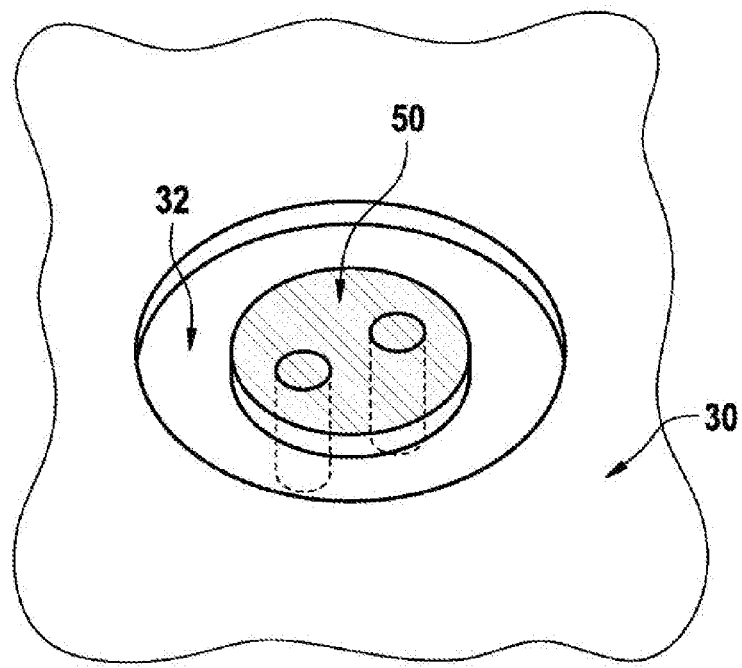
FIG. 3 shows a perspective view of the cooling body of the control device according to the disclosure represented in FIG. 1.

FIG. 3 shows a perspective view of the cooling body of the control device according to the disclosure represented in FIG. 1.

Only the cooling body 30 of the control device 10 is represented. It can clearly be seen that the recess 32, in the lateral direction, radially encloses the region 50 which is to be protected over its entire perimeter.

Figure 4:
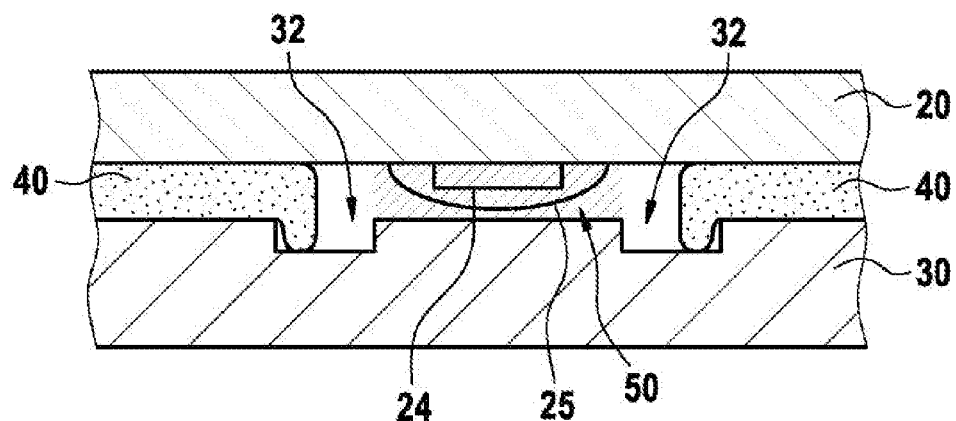
FIG. 4 shows part of a sectional view of a second exemplary embodiment of a control device according to the disclosure.

FIG. 4 shows a sectional view of a second exemplary embodiment of a control device according to the disclosure.

This second exemplary embodiment according to FIG. 4 only differs from the first exemplary embodiment according to FIG. 1 or according to FIG. 2 in that, in place of a component 22 with push-through contact-connections 23 configured in a slug-down technical arrangement, a component 24 is arranged within the region 50 which is to be protected. In particular, the component 24 is covered by a coating 25, which is also arranged within the region 50 which is to be protected, as a result of which contact between the coating 25 and the heat-conducting paste 40 can be prevented. The coating 25 can be configured, for example, as a polymer film.

The invention claimed is:

1. A control device for an electrical machine, the control device comprising:
    a circuit board;
    a cooling body joined to the circuit board;
    a heat-conducting paste introduced between the circuit board and the cooling body and configured to thermally connect the circuit board to the cooling body,
    wherein at least one of the circuit board and the cooling body defines at least one recess extending in a lateral direction between a region which is to be protected and the heat-conducting paste such that, when the circuit board and the cooling body are joined, an excess portion of the laterally spreading heat-conducting paste is accommodated in the at least one recess.

2. The control device as claimed in claim 1, wherein the recess is configured as a slot.

3. The control device as claimed in claim 1, wherein the at least one recess entirely encloses the region which is to be protected.

4. The control device as claimed in claim 1, wherein at least part of an electrical contact-connection of an electronic component with the circuit board is arranged within the region which is to be protected.

5. The control device as claimed in claim 4, wherein the electronic component is configured in a slug-down technical arrangement.

6. The control device as claimed in claim 1, wherein at least one electronic component is arranged in the region which is to be protected.

7. The control device as claimed in claim 3, wherein the at least one recess entirely encloses the region which is to be protected in the lateral direction.

8. The control device as claimed in claim 4, wherein the at least part of the electrical contact-connection includes part of a push-through contact-connection.

9. The control device as claimed in claim 6, wherein the at least one electronic component includes at least one of a sensor unit and a component which is covered by a coating.

* * * * *